(12) United States Patent
Huang et al.

(10) Patent No.: US 8,288,850 B2
(45) Date of Patent: Oct. 16, 2012

(54) METHOD FOR PACKAGING MICROMACHINED DEVICES

(75) Inventors: Jung-Tang Huang, Taipei (TW); Ming-Jhe Lin, Taipei (TW); Hou-Jun Hsu, Taipei (TW)

(73) Assignee: Jung-Tang Huang, Taipei (TW)

( * ) Notice: Subject to any disclaimer, the term of this patent is extended or adjusted under 35 U.S.C. 154(b) by 131 days.

(21) Appl. No.: 12/803,872

(22) Filed: Jul. 9, 2010

(65) Prior Publication Data

US 2011/0018113 A1    Jan. 27, 2011

(30) Foreign Application Priority Data

Jul. 7, 2009  (TW) .............................. 98122860 A

(51) Int. Cl.
*H01L 21/768*  (2006.01)
*H01L 23/498*  (2006.01)

(52) U.S. Cl. . 257/684; 257/690; 257/691; 257/E21.589; 257/E23.068

(58) Field of Classification Search .................. 257/684, 257/E21.589, E23.068, 690, 691, 730; 438/107–109
See application file for complete search history.

(56) References Cited

U.S. PATENT DOCUMENTS 7,295,029 B2* 11/2007 Zhao ............................. 438/110

* cited by examiner

*Primary Examiner* — Julio J Maldonado
*Assistant Examiner* — Daniel Shook

(57) ABSTRACT

A method for packaging micromachined devices fabricated by MEMS and semiconductor process is disclosed in this invention. The method employed etching technique to etch a trench surrounding the micromachined components on each chip of the first wafer down to the bottom interconnection metal layer. The said trench can accommodate the solder of flip-chip packaging. On each chip of the second wafer, or called as the second chip, a surrounding copper pillar wall corresponding to the trench on the first chip is deposited. By wafer-level packaging, the trench on the first chip is aligned to the pillar wall, and then bonded together with elevated temperature. The face-to-face chamber formed between two chips can allow the movement of the micromachined structures. Further, the signal or power connections between two chips can be established by providing several discrete pillar bumps.

20 Claims, 5 Drawing Sheets

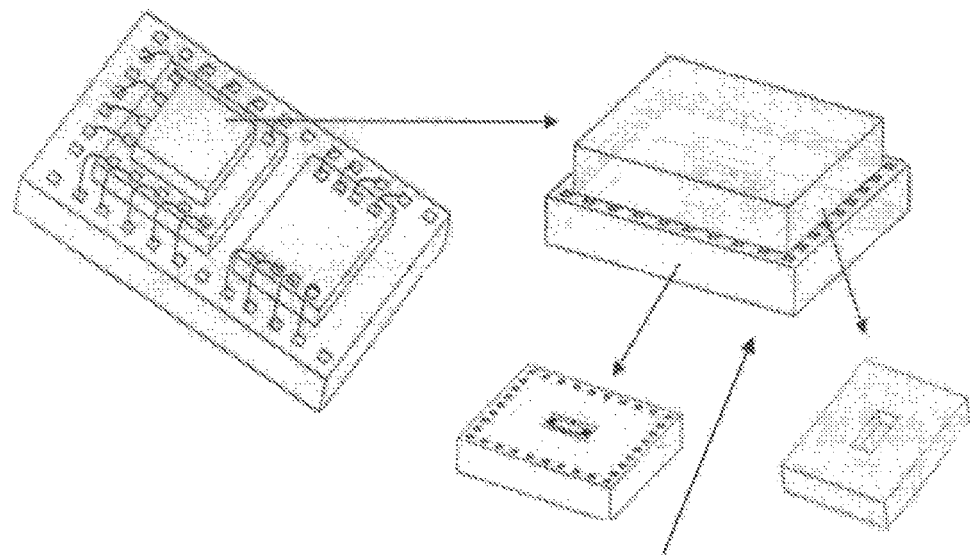
Figure 1 (a)
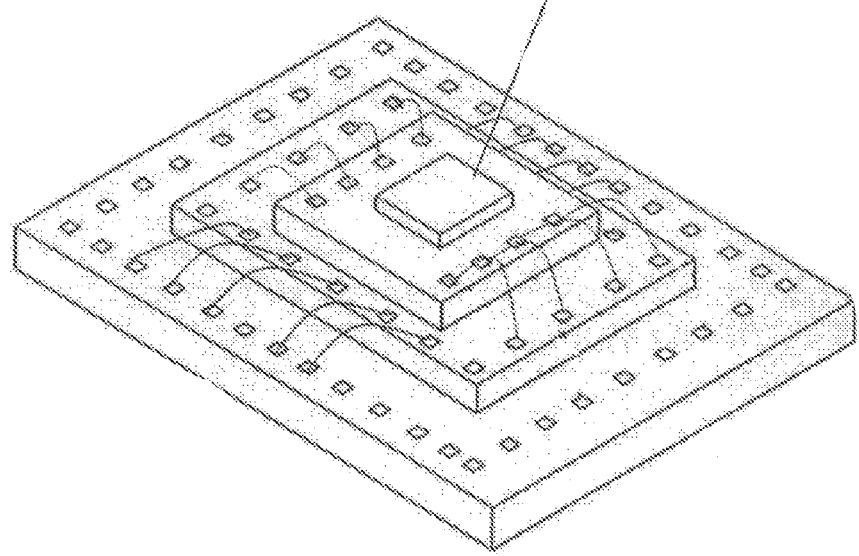
Figure 1 (b)
Figure 1
--PRIOT ART--

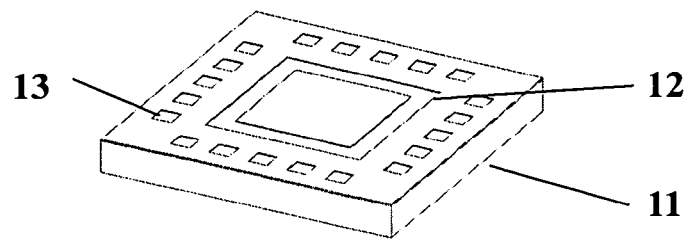
Figure 2(a)
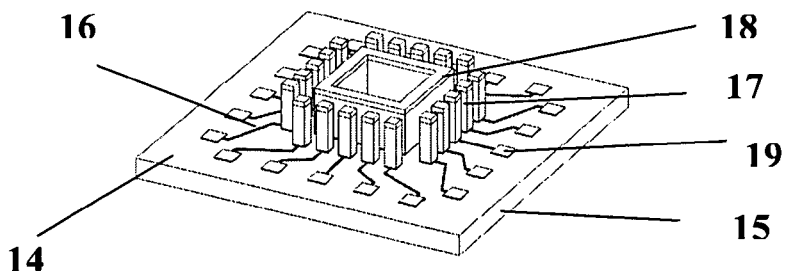
Figure 2(b)
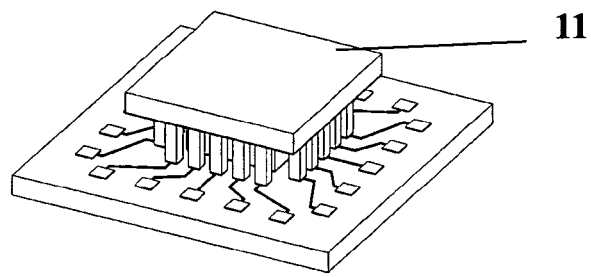
Figure 2(c)
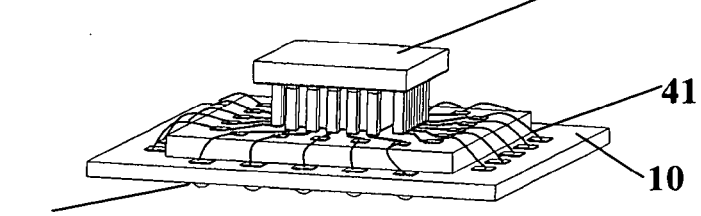
Figure 2(d)
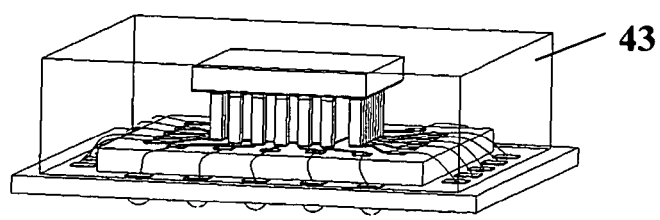
Figure 2(e)
Figure 2

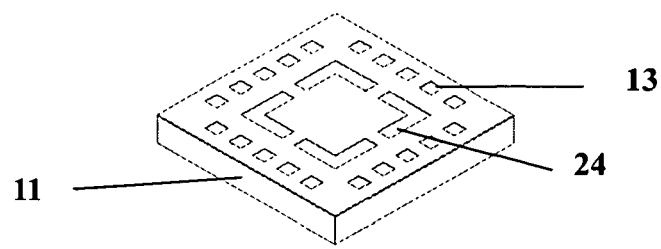
Figure 3 (a)
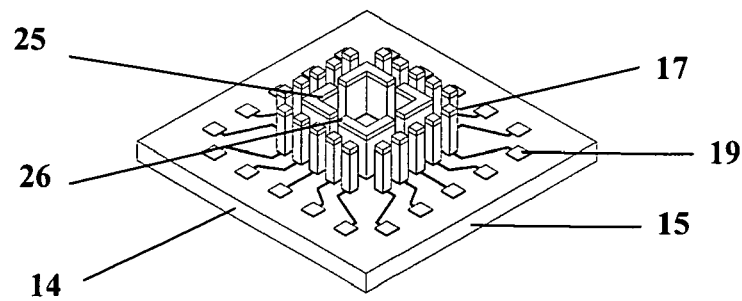
Figure 3 (b)
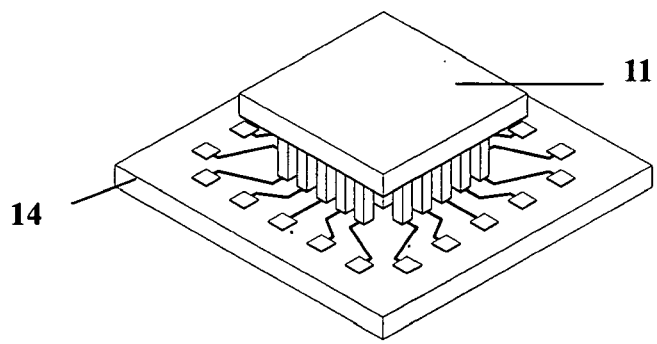
Figure 3 (c)
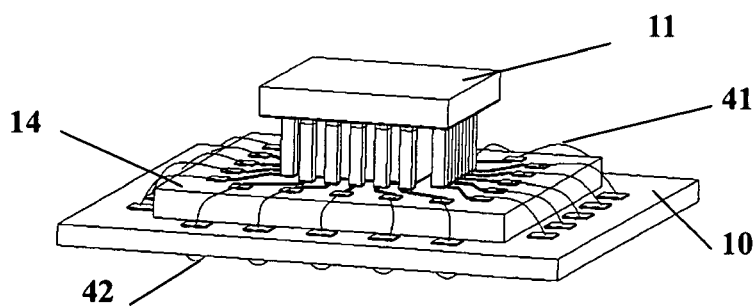
Figure 3 (d)
Figure 3

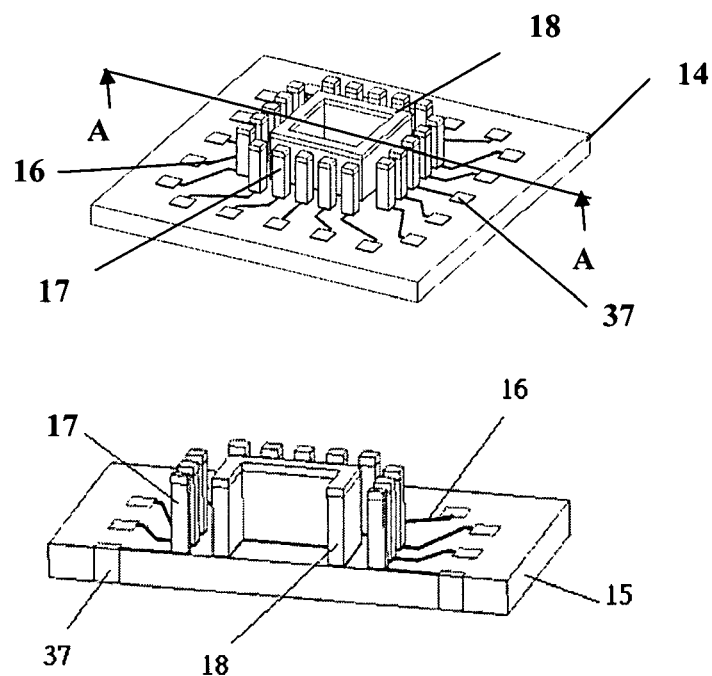
Figure 4 (a)
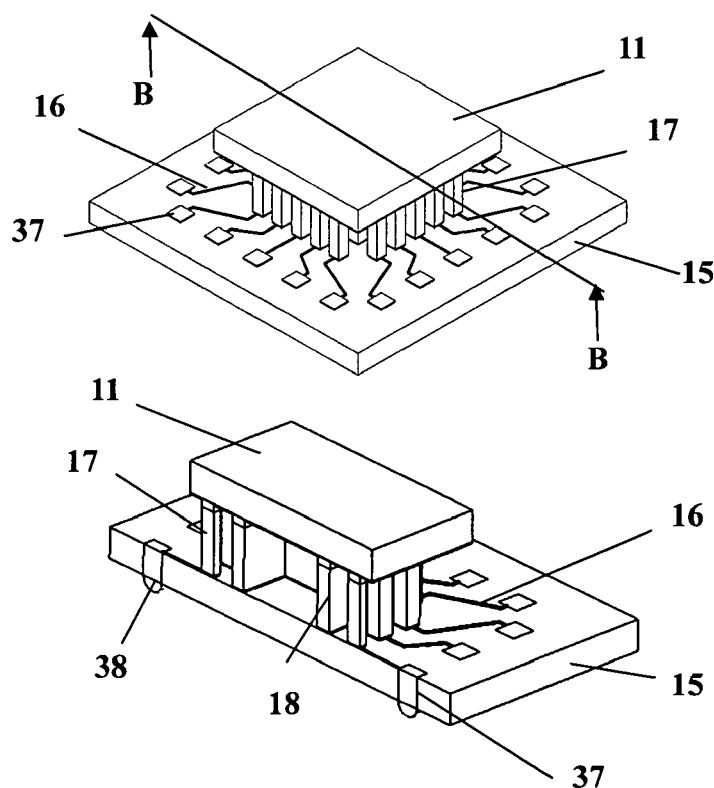
Figure 4 (b)
Figure 4

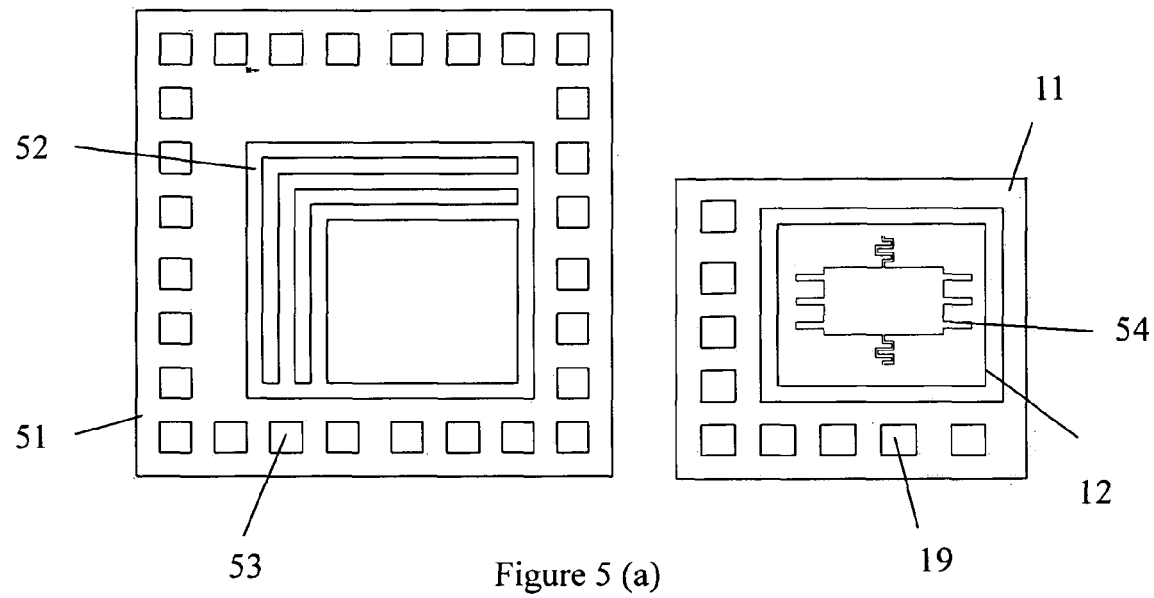
Figure 5 (a)
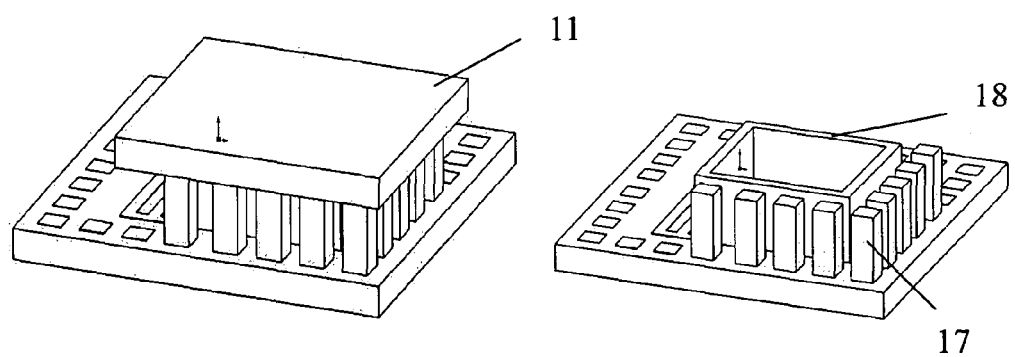
Figure 5 (b)
Figure 5

METHOD FOR PACKAGING MICROMACHINED DEVICES

FIELD OF INVENTION

The present invention relates generally to the field of semiconductor manufacturing and Micro Electro Mechanical Systems (MEMS), or further extends to micromachined devices. More specifically, the present invention relates to methods for packaging of micromachined devices and other devices, and in some cases, devices that have nanomaterials, or devices that have multi-functions such as power system, MCU, antenna, RF, etc.

DESCRIPTION OF RELATED ART

The current packaging process for micromachined devices can separate into two parts, 0-level packaging and 1-level packaging.

The 0-level packaging is using non-functional substrates such as pure silicon, glass, ceramic to be a cap and to seal the micromachined structures. The adhesive material between the cap and the micromachined structures are usually macromolecule components like Benzocyclobutane (BCB), gold and glass frit. The thickness of the adhesive layer usually is less than 4 micrometers, which cannot offer enough active space for motion devices such as gyro and actuator. Therefore, the possible method to overcome space issue is to etch a cavity on either the cap chip or the carrier chip.

Using Benzocyclobutane (BCB) as bonding medium employs heat (<250° C.) to melt BCB material and to evaporate the solvent, which can combine the cap with the micromachined structures rigidly. Advantages of BCB bounding include: (1) the working area can easily be defined before hardening or curing of BCB; (2) the curing process (<250° C.) would not damage the circuits and metal structures in chip; (3) BCB has strong bonding strength, very low dielectric loss, high resistance and better compatibility, which is good for MEMS products packaging.

The drawbacks of BCB bonding include: (1) prone to collapse in dispensing process; (2) emitting volatile gases during curing process; thus lead to poor process reliability. All of above drawbacks seriously affect the performances and the vacuum level of MEMS products. Furthermore, BCB is not conductive and can not conduct signals or electric power or heat dissipation except for bonding the cap with micromachined structures on the purpose of protection.

Other bonding methods includes Eutectic Bonding and Anodic Bonding, which are merely suitable for particular materials such as silicon and Pyrex glass. These two methods have to work in high temperature and high pressure environment, which will damage the brittle MEMS devices and decrease the yield rates. And equipments of Eutectic Bonding or Anodic Bonding equipment are very expensive, which will increase the process costs.

The second parts of packaging, or 1-level packaging, is applied to integrate micromachined device chip with integrated circuit (IC) chip on a PCB (printed circuit board) by bonding wire, solder balls. Wire bonding is generally the most cost-effective and the diameters of wire are up to 100 micrometer. Flip chip packaging is also a method for interconnecting MEMS devices chip to signal conditioning IC chip, which follow by wire bonding to PCB. Generally, wire-bond and flip chip are not suitable for fine pitch devices, and TVS has complex processes and high process costs.

Typically, known micromachined structures merely bond with the cap in most cases. The capped micromachined structures either are respectively mounted to PCB board with other functional chips, shown as FIG. 1(a), or are vertically staked on functional chips and PCB board, shown as FIG. 1(b). Usually, all signals or electric power communicated to micromachined structures and functional chips are connected to PCB board by bonding wire. The functional chips may be micro controller unit, measuring circuits, etc. The drawbacks of these known micromachined structures include, for example, (1) the size is too big; (2), a complicated process is required; and (3) a non-functional cap only for mechanical protection purpose is needed. Besides, the long bonding wire can result in poor signal noise ratio and be confined to low frequency application.

In order to reduce product costs and sizes, the system on chip (SOC) technology was developed to allow circuits and micromachined structures to embed in one chip. Although the SOC technology can integrate circuits and micromachined structures in one chip, the fabrication and packaging process of the SOC are complicated. In addition, the SOC still needs a cap for protection purpose.

SUMMARY

Accordingly, the present invention provides a packaging technology for micromachined devices, fabricated by MEMS and CMOS technology by using a machined device comprising a first chip (as a capping chip) with at least one surrounding trench, and a second chip (as a carrier chip) with at least one surrounding wall and micromachined structures insides so that the at least one chamber is formed between the surrounding trench and the surrounding wall for accommodating the micromachined structures.

The present invention is to provide a packaging method for micromachined devices by CMOS and MEMS technology. The micromachined devices here are defined to be formed by the first chip and the second chip. The first chip, as a capping chip, containing micromachined structures, comprises appropriate surrounding trench and I/O pads for packaging and transmitting signals. The second chip, as a carrier chip, comprises the surrounding wall and the copper pillars by electroplating and polishing processes. Copper pillars are applied to conduct signals or electric power between the first chip and the second chip. Finally, bond two chips by using flip-chip technology. Furthermore, the copper pillars can be used as non-signal transmission purpose. In other words the copper pillars or surrounding wall can be used as heat dissipation path or filter for blocking the dust or particles in the environment when multiple dummy copper pillars and vented surrounding walls are distributed around the micromachined structures needed to contact environment.

The invention can simultaneously accomplish 0-level packaging and 1-level packaging by copper pillars to form the surrounding wall and signal conductors. The advantages of copper pillars contain: (1) good process reliability; (2) good mechanical properties; (3) good thermal conductivity; (4) Pb-free; (5) less risk of collapse during reflow process; (6) no deformation issues after packaging; (6) minimizing chip size.

The advantages of this invention include: (1) providing a packaging method for micromachined devices; (2) providing at least one chamber or active space for micromachined structures by bonding with the surrounding trench and wall; (3) avoiding collapse problems and reducing the risk of hurting micromachined devices by using copper pillars; (4) minimizing packaging size; (5) controlling vacuum pressure by high coplanarity of copper pillars for hermetically bonding two chips; (6) providing strong functions by integrating with micro controller unit (MCU) and copper pillar conductors on the carrier chip.

BRIEF DESCRIPTION OF DRAWINGS

The detailed drawings of this invention will be fully understood from the following descriptions wherein:

FIG. 1 shows a schematic assembly drawing of prior arts

FIG. 2 shows a schematic process flow for packaging micromachined devices without environmental exposure.

FIG. 3 shows a schematic process flow for packaging micromachined devices with environmental exposure.

FIG. 4 shows a schematic process flow by using TSV technology to package micromachined devices.

FIG. 5 provides a schematic 3-D view of assembling MCU chip with the chip containing micromachined structures.

The following description should be read with reference to the drawings, in which like elements in different drawings are numbered in like fashion. The drawings, which are not necessarily to scale, depict selected embodiments and are not intended to limit the scope of the invention. Although examples of construction, dimensions, and materials are illustrated for the various elements, those skilled in the art will recognize that many of the examples provided have suitable alternatives that may be utilized. While the fabrication of micromachined sensors such as MEMS gyroscopes, MEMS accelerometers and electrostatic actuators is specifically discussed, it should be understood that the fabrication steps and structures described herein can be utilized in the packaging of NEMS devices such as, carbon nanotube based sensor, nanocomposite base sensor and/or any other suitable device (MEMS or NEMS), as desired.

DETAILED DESCRIPTION

The invention aims at developing an advanced and low cost wafer-level package method for micromachined devices such as accelerometer, gyroscope, pressure sensor and microphone. This invention of packaging method comprises the steps of (1). establishing surrounding trench and signal I/O pads on the first chip; (2). building conductor copper pillars, surrounding wall and signal lines and I/O pads on the second chip; (3). using Flip Chip technology to combine the first chip with the second chip.

The detail processes of conductor copper pillars and surrounding wall comprise the steps of (1). sputtering UBM layer; (2). coating first layer of photoresist (PR) film; (3). baking, exposing, and developing the first layer of PR film; (4). electroforming copper pillars; (5). polishing and planarizing copper pillars; (6). coating second layer of PR film; (7). baking, exposing, and developing the second layer of PR film; (8). electroforming solder bumps; (9). polishing and planarizing solder bumps; (10). removing PR films.

Referring to the attached drawings, an advanced wafer-level package method for micromachined devices will be illustrated in detail as follows.

Embodiment 1

Referring to FIG. 2, it illustrates the schematic process flow for packaging sensors without environmental exposure such as accelerometer, gyroscope, absolute pressure sensor, and micro-switch. Usually, this kind of micromachined devices need hermetically sealed package. The process of this embodiment comprises the following steps of:

Step 1, Designing the First Chip

Employing standard semiconductor process such as 0.35 μm CMOS processes to produce the first chip 11 on wafer. The first chip has to set up I/O pads 13 and surrounding trench 12 for signal connections and bonding with the surrounding wall 18, shown as FIG. 2 (a). The surrounding trench 12 is fabricated by etching technology to etch canal until metal layer around micromachined structures. The function of trench is to provide enough space accommodating solder for bonding process. The depth of trench can be defined by etching to different metal layer (metal 1, metal 2, metal 3 and metal 4), depending on devices' requirements.

Further, if the micromachined structures have to transmit signals and need to pass through surrounding trench 12 to connect I/O pads 13, M1 layer can be employed to arrange signal lines and the bottom of the trench can be chosen from M4 to M2 layer by etching. If micromachined structures do not demand to transmit signals, the bottom of the trench can be the lowest layer of metal after etching. Furthermore, by CMOS-MEMS technology, the first chip and circuits such as amplifier and drivers are allowed embedding into one chip. The circuits prefer to layout outside the surrounding trench 12 and connect to micromachined structures by interior metal lines. The outputs of the circuits are then connected to I/O pads 13.

Step 2, Designing and producing the second chip 14 on substrate

The second chip, built in the substrate 15, can further include multi functions such as power system, microcontroller unit (MCU), RF circuit, and antenna or measuring circuits 16. And then, utilizing photo lithography, electroforming and polishing processes to establish surrounding wall 18 and copper pillar bumps 17 which are applied to conduct signals, shown as FIG. 2(b). The electroforming of the surrounding walls and bump pillars comprises the step of electroplating or chemical-plating. In order to bond the first chip with the second chip, the position of copper pillar bumps 17 and surrounding wall 18 have to correspond to the position of I/O pads 13 and surrounding trench 12 respectively. The height and width of copper pillar bumps 17 can be established from 1 μm to 500 μm, and the height and width of surrounding wall 18 can be established from 1 μm to 500 μm. The preferable height and width of copper pillar bumps 17 and surrounding wall 18 are from 10 μm to 100 μm, respectively. In most of cases, the height of copper pillar bumps 17 and surrounding wall 18 is designed with the same value. Moreover, by electroforming and polishing processes, the dimensions, uniformity and coplanarity of copper pillar bumps 17 and surrounding wall 18 can be controlled accurately. In some cases, carrier chip 14 can be non-functional chip and be made of pure silicon wafer or ceramic.

Step 3, Bonding Process

By standard flip-chip bonding equipment which has vacuum controller, processing gas provider and infrared lines aligner, the first chip 11 and the second chip 14 can be aligned and combined by the reflow process, shown as FIG. 2 (c). In semiconductor industry, the reflow process has a good reliability and works near 250° C., which could not damage the first chip and embedded circuit, and no contamination issues. For the requirement of hermetically package this invention can further deposing getter material inside the surrounding trench on the first chip or the surrounding wall on the second chip to absorb humidity and maintain the vacuum level, after step 1 and step 2. The getter deposition may be preferably applied to the second chip since there is no micromachined structure on the chip. Consequently, after reflow process (temperature near 300° C. and keeping at least 15 minutes), the controlled vacuum pressure may be, for example, 1 atmosphere, 0.5 atmosphere, less than $10^{-2}$ torr, less than 0.1 torr, less than $10^{-3}$ torr, or less than $10^{-4}$ torr.

Step 4, Dicing and Surface Mounting Process

After bonding the above two chips (wafers), the assembled chips have to be diced into dies. In order to expose the I/O pads on the carrier chip, the dicing is only to cut out the part outside the bonding pads and trenches of the first chip. And then use surface mount technology (SMT) to mount bonded chips to interposer 10, and wire bonding to connect I/O pads on carrier chip 14 with I/O pads on interposer 10, shown as FIG. 2 (d). Interposer 10 can be a PCB board with connection lines and solder bumps on its backside used to connect with another substrate. Further, the final package can also be realized as Ball Grid Array (BGA) or Quad Flat No leads (QFN) or other available SMT ones.

Step 5, Encapsulation Process

Usually, the plastic encapsulation of the above assembled chips from Step 4 can be implemented to reach full protection as shown in FIG. 2(e).

Here, it is important to note that the above description of Embodiment 1 can be based on the chip-level or wafer-level process.

Embodiment 2

Referring to FIG. 3, it illustrates the process flow for micromachined devices with environmental exposure such as microphone, gas sensor, flow sensor, humidity sensor, gauge pressure sensor etc. In order to allow micromachined devices to detect physical or chemical quantities from environment, the surrounding trench 24 and surrounding wall 25 has to form vent holes 26, shown as FIG. 3(a) and FIG. 3 (b). The packaging processes are similar to Embodiment 1, shown as FIG. 3 (c) and FIG. 3 (d), except the plastic encapsulation process is canceled.

Embodiment 3

Referring to FIG. 4, in the above two examples, the pads 13 for wire bonding on the second chip 14 can also be connected to the backside of the second chip 14 by utilizing Through Silicon Via 17 (TSV) and then attaching solder balls or bumps 38 to directly become a fully packaged sensor or actuator. By deleting interposer 10, this embodiment can reduce volume and cost of micromachined products.

TSV technology has been applied in semiconductor industry several years and used to connect multiple ICs together in a package. The process of TSV comprises the following steps of: 1. forming through holes by using wet/dry etching technology or laser; 2. filling copper by electroforming. Electroforming is a common process, which soaks substrates in Cu bath with current. Furthermore, before filling through holes with Cu, deposing isolation layer and barrier layer are significant and seriously affect the performances of devices. Isolation layer is used to isolate Si-substrate and Cu and barrier layer is used to avoid cu-atoms diffusing to Si-substrate. After deposing isolation layer and barrier layer, the next step is to depose copper seed layer for electroforming process. The copper seed layer has to be deposed carefully; otherwise the defects in copper seed layer will induce voids in the electroformed Cu. The deposing method of the above three layers is usually to use PVD or CVD. The packaging process can be further to include plastic encapsulation to protect the integrated chips from Step 4, shown as FIG. 2 (e).

Embodiment 4

Referring to FIG. 5, the second chip contains Micro Controller Unit 51(MCU), multiple surrounding continuous pads 52, corresponding to surrounding trench 12 on the first chip and at least three bump pads 53. One of the surrounding continuous pads 52 on the second chip is selected to be deposited into surrounding wall 18, which is corresponding to the surrounding trench 12 of the first chip and is depending on the size of the micromachined structures 54, shown as FIG. 5 (a). And bump pads 53 are also deposited into bump pillars 17 according to the signals or electric power required to I/O pad 19 of the first chip, shown as FIG. 5 (b). The advantages of embodiment 4 are that: (1) enhancing performances and forming the smart sensor by assembling MCU with the first chip; (2) providing the more flexible applications to different size of various micromachined structures 54, without redesigning the layout of MCU; (3) reducing the manufacturing cost. The packaging processes are similar to Embodiment 1.

In summary, the advantages of this invention include:

1. Decreasing manufacturing cost, by CMOS-MEMS technology, micromachined structures, circuits, surrounding trench can be fabricated meanwhile;

2. Enhancing vacuum level and yield rates, compared with traditional MEMS package, surrounding wall made of copper pillars is stronger and more reliable by using polishing to reach high coplanarity and uniformity, and precise dimension;

3. Simplifying packaging process, while the traditional MEMS package method has to use several semiconductor processes to finish the 0-level and the 1-level packaging, which increase the process cost and jeopardize the micromachined devices during processes. This invention employs electroplating to establish the surrounding trench and wall to package micromachined structures, which can simultaneously accomplish the 0-level and the 1-level packaging without complex processes;

4. Providing multi functional devices to form smart sensor or actuator, the carrier chip can further embed micro controller unit, antenna, RF etc to enhance the performance of micromachined devices for example to store calibration data in micro controller unit;

5. Minimizing the size of sensor, the traditional MEMS package method uses Benzocyclobutane (BCB) to assembly micromachined structures with cap, which must occupy much space for packaging and be difficult to precisely regulate the packaging areas. This invention employs MEMS processes, electroplating and polishing processes to establish the surrounding wall and bump pillars to bond the first chip and the second chip to minimize packaging areas.

6. Providing flexible packaging method, the traditional MEMS package method need a specific cap, which usually limits the shapes of micromachined devices, the dimensions of MEMS package areas, the position of vent holes and the height of the active chamber. This invention employs electroplating to form vent holes or not on the surrounding wall, to determine the width and height of the surrounding wall and to form different shapes of the surrounding wall and trench such as square, circle, hexagon, octagon etc.

Alternatively, or in addition, the entire process may take place in multiple chambers so that multiple micromachined structures may be simultaneously bonded to multiple corresponding surrounding walls, as desired. Some of the multiple micromachined structures may need hermetically sealed, while some may need to contact the environment. It is also contemplated that the operability of the micromachined device may be verified prior to or after the micromachined device and the MEMS package are secured together.

Having thus described the several embodiments of the present invention, those of skill in the art will readily appreciate that other embodiments may be made and used which fall within the scope of the claims attached hereto. Numerous advantages of the invention covered by this document have been set forth in the foregoing description. It will be understood that this disclosure is, in many respects, only illustrative. Changes may be made in details, particularly in matters of shape, size and arrangement of parts without exceeding the scope of the invention.

What is claimed is:

1. A micromachined device comprising:
   a first chip with one or more micromachined structures, comprising at least one surrounding trench, and at least one I/O pad built inside or outside the surrounding trench;
   a second chip, comprising at least one surrounding wall that corresponds with the surrounding trench on the first chip, and at least one bump pillar for transmitting signals or electric power, built inside or outside the wall;
   wherein at least one chamber for accommodating the micromachined structures is formed by bonding the surrounding trench on the first chip with the surrounding wall on the second chip and the I/O pad on the first chip is connected with the bump pillar on the second chip.

2. The device of claim 1, wherein the bump pillar and the surrounding wall are made of at least two layers, comprising one bottom layer of copper pillar and one top layer of solder ball.

3. The device of claim 1, wherein the micromachined device further comprises a power amplifier.

4. The device of claim 1, wherein the micromachined device further comprises drivers.

5. The device of claim 1, wherein the micromachined device further comprises measuring circuits.

6. The device of claim 1, wherein the second chip further comprises at least a circuit selected from the group consisting of a measuring circuit, a Micro Controller Unit (MCU), RF, and antenna.

7. The device of claim 1, wherein the surrounding trench and the corresponding surrounding wall are formed with the same shapes, while the shapes are selected from the group consisting of square, circle, hexagon, and octagon.

8. The device of claim 1, wherein the surrounding wall has vent holes.

9. The device of claim 1, wherein the surrounding wall has no vent holes.

10. The device of claim 1, wherein the height of the surrounding wall has a height of from 1 μm to 500 μm.

11. The device of claim 1, wherein the diameter of bump pillar and the width of surrounding wall respectively range from 5 μm to 500 μm.

12. The device of claim 1, wherein the chamber provides a space for accommodating getter material.

13. The device of claim 1, wherein the bump pillars and the surrounding wall are used as heat dissipation paths.

14. The device of claim 1, wherein the second chip further comprises the I/O pads for wire bonding to the corresponding I/O pads on an interposer.

15. The devise of claim 1, wherein the second chip further comprises the I/O pads with Through Silicon Via (TSV) connected to solder balls or bumps on the backside of the chip.

16. A method for packaging a micromachined device, comprising the steps of:
   providing a first chip with a micromachined structure, comprising at least one surrounding trench that corresponds with the surrounding wall on the second chip, and at least one I/O pad built inside or outside the surrounding trench, for connecting to the bump pillar on the second chip;
   providing a second chip, comprising at least one surrounding wall, and at least one bump pillar for transmitting signals or electric power, built inside or outside the wall and connecting to the I/O paid on the first chip;
   aligning the surrounding trench on the first chip with the surrounding wall on the second chip;
   sealing the chips by bonding the surrounding trench on the first chip to the surrounding wall on the second chip to form a package, and to form electric connections between I/O pads on the first chip and the bump pillars on the second chip.

17. The method of claim 16, wherein the surrounding walls and the bump pillars are electroplated or chemical-plated before the packaging.

18. A micromachined device comprising:
   a first chip with one or more micromachined structures, comprising at least one surrounding trench that accommodates solder for packaging on the first chip, and at least one I/O pad built outside surrounding trench on the first chip and employed to transmit signals or electric power in or out micromachined structures;
   a second chip with a Micro Controller Unit (MCU), comprising two or more surrounding continuous pads that correspond to the surrounding trench on the first chip, and at least three bump pads used to bond to the bump pillars and for transmitting signals or electric power to I/O pads of the first chip;
   wherein at least one chamber for accommodating the micromachined structures is formed by bonding the surrounding trench on the first chip with the surrounding wall on the second chip, and at least three signal connections are formed by bonding I/O pads on the first chip with the bump pillars on the second chip.

19. The device of claim 18, wherein one of the surrounding continuous pads on the second chip is selected to be bonded to surrounding wall that corresponds to the surrounding trench on the first chip.

20. The device of claim 18, wherein the three bump pillars provide at least functions of a power supply voltage, ground, and an amplified output, respectively.

* * * * *